United States Patent
Wiley

(10) Patent No.: US 11,032,956 B1
(45) Date of Patent: Jun. 8, 2021

(54) COMPONENT FEEDER MECHANISM WITH FLOATING FRAME

(71) Applicant: Automation Technical Service Inc, San Diego, CA (US)

(72) Inventor: Kelvin Wiley, San Diego, CA (US)

(73) Assignee: Automation Technical Service Inc, San Diego, CA (US)

( * ) Notice: Subject to any disclaimer, the term of this patent is extended or adjusted under 35 U.S.C. 154(b) by 0 days.

(21) Appl. No.: 17/162,657

(22) Filed: Jan. 29, 2021

Related U.S. Application Data

(60) Provisional application No. 62/968,137, filed on Jan. 30, 2020.

(51) Int. Cl.
*H05K 13/02* (2006.01)
*H05K 13/04* (2006.01)

(52) U.S. Cl.
CPC ......... *H05K 13/02* (2013.01); *H05K 13/0417* (2013.01); *H05K 13/0419* (2018.08); *Y10T 29/53174* (2015.01)

(58) Field of Classification Search
CPC .............. H05K 13/02; H05K 13/0417; H05K 13/0419; H05K 13/086; Y10T 29/53174; Y10T 29/53178; Y10T 29/53261
See application file for complete search history.

(56) References Cited

U.S. PATENT DOCUMENTS

| 4,820,369 | A | 4/1989 | Kubo |
| 7,017,731 | B2 | 3/2006 | keda et al. |
| 8,353,424 | B2 | 1/2013 | Ikeda et al. |
| 8,678,065 | B2 | 3/2014 | Hwang et al. |
| 9,055,709 | B2 | 6/2015 | Shin et al. |
| 9,642,294 | B2 | 5/2017 | Karlsson et al. |
| 10,285,313 | B2 | 5/2019 | Murase et al. |
| 10,426,069 | B2 | 9/2019 | Ohashi et al. |

(Continued)

FOREIGN PATENT DOCUMENTS

| EP | 1508262 B1 | 2/2011 |
| EP | 2820930 A | 1/2015 |

OTHER PUBLICATIONS

Application No. PCT/US2021/015777, International Search Report and Written Opinion, dated Apr. 14, 2021, 15 pages.

*Primary Examiner* — Peter Dungba Vo
*Assistant Examiner* — Joshua D Anderson
(74) *Attorney, Agent, or Firm* — Kilpatrick Townsend & Stockton LLP

(57) ABSTRACT

A mechanism comprising a base having a top surface and including a groove extending along the top surface and a frame flexibly coupled to the base. The frame includes a right side attached to a left side. The right side has a substantially "L-shaped" cross-section and includes a knife portion and a creasing portion. The left side includes a substantially "L-shaped" cross-section and is rigidly coupled to the right side such that the frame has a substantially "U-shaped" cross-section that is sized to receive at least a portion of the base. A first spring is positioned proximate the knife portion and is arranged to control a compressive force between the knife portion and the base and a second spring is positioned proximate the creasing portion and is arranged to control a compressive force between the creasing portion and the base.

20 Claims, 23 Drawing Sheets

(56) References Cited

U.S. PATENT DOCUMENTS

| | | | |
|---|---|---|---|
| 2010/0239401 A1* | 9/2010 | Kim | B65H 37/002 |
| | | | 414/412 |
| 2012/0305585 A1* | 12/2012 | Nagao | H05K 13/0419 |
| | | | 221/25 |
| 2014/0318713 A1 | 10/2014 | Wiley | |
| 2014/0367049 A1* | 12/2014 | Higuchi | H05K 13/0419 |
| | | | 156/719 |
| 2015/0382523 A1 | 12/2015 | Hwang et al. | |
| 2018/0160576 A1* | 6/2018 | Ohashi | H05K 13/0419 |

* cited by examiner

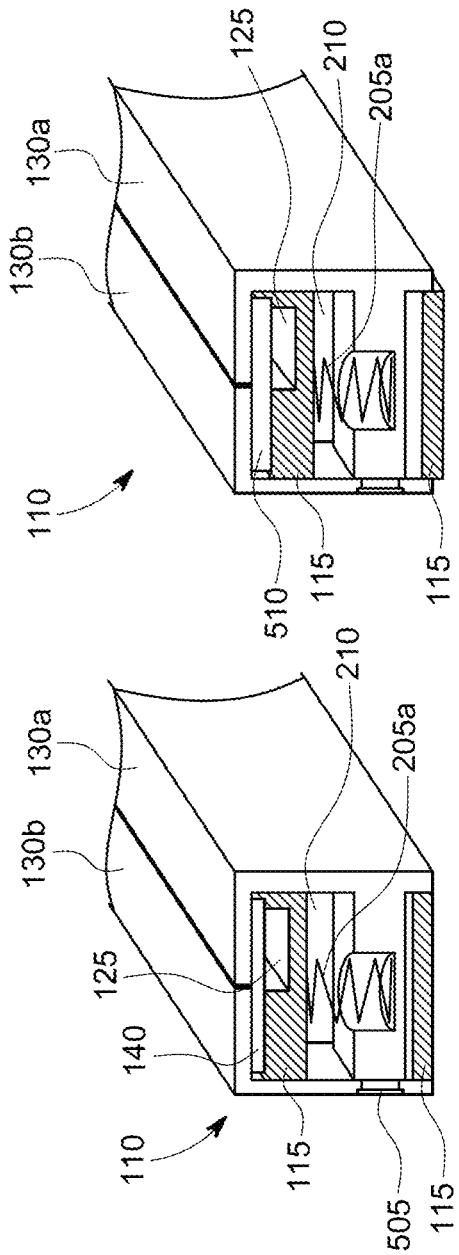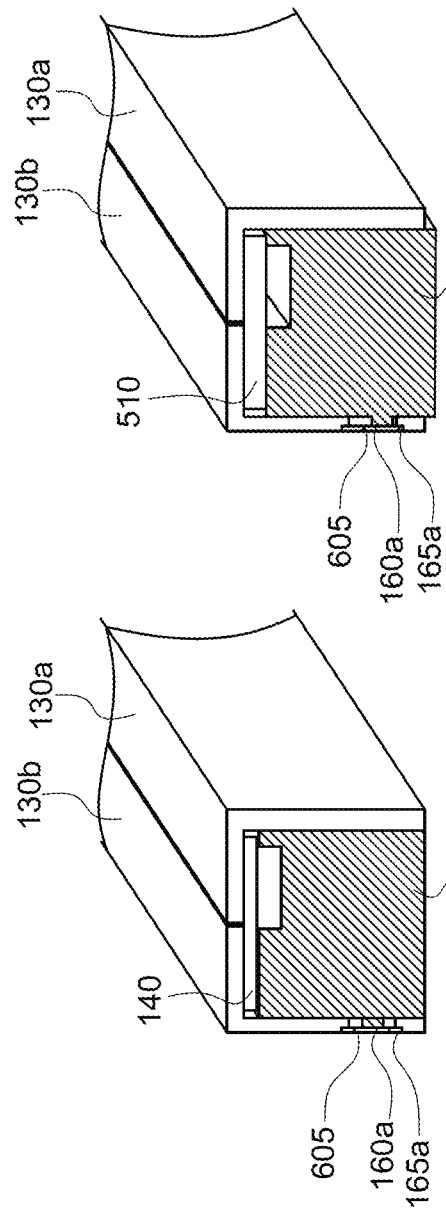

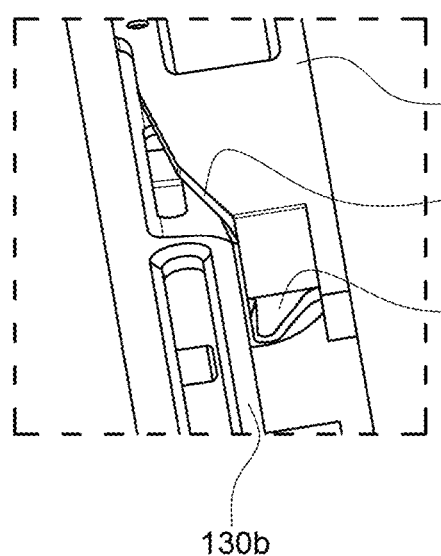 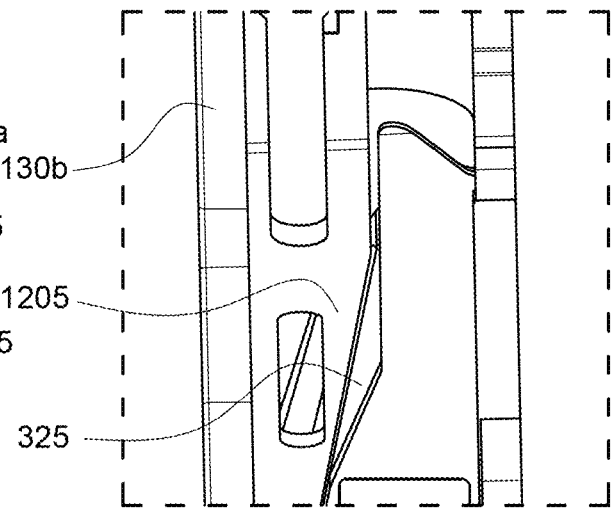
FIG. 12  FIG. 13
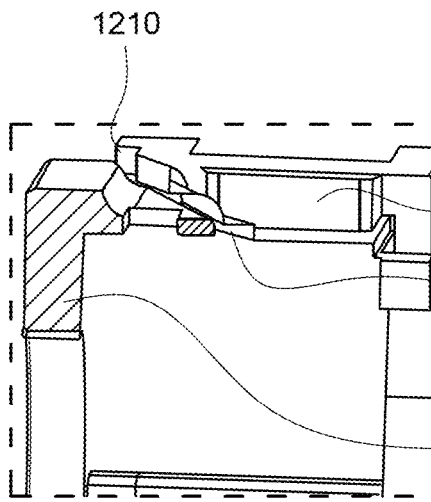 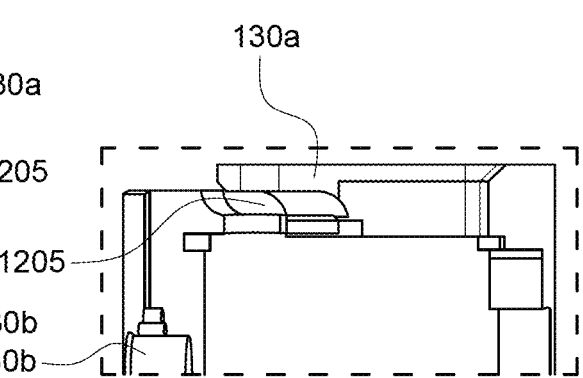
FIG. 14  FIG. 15

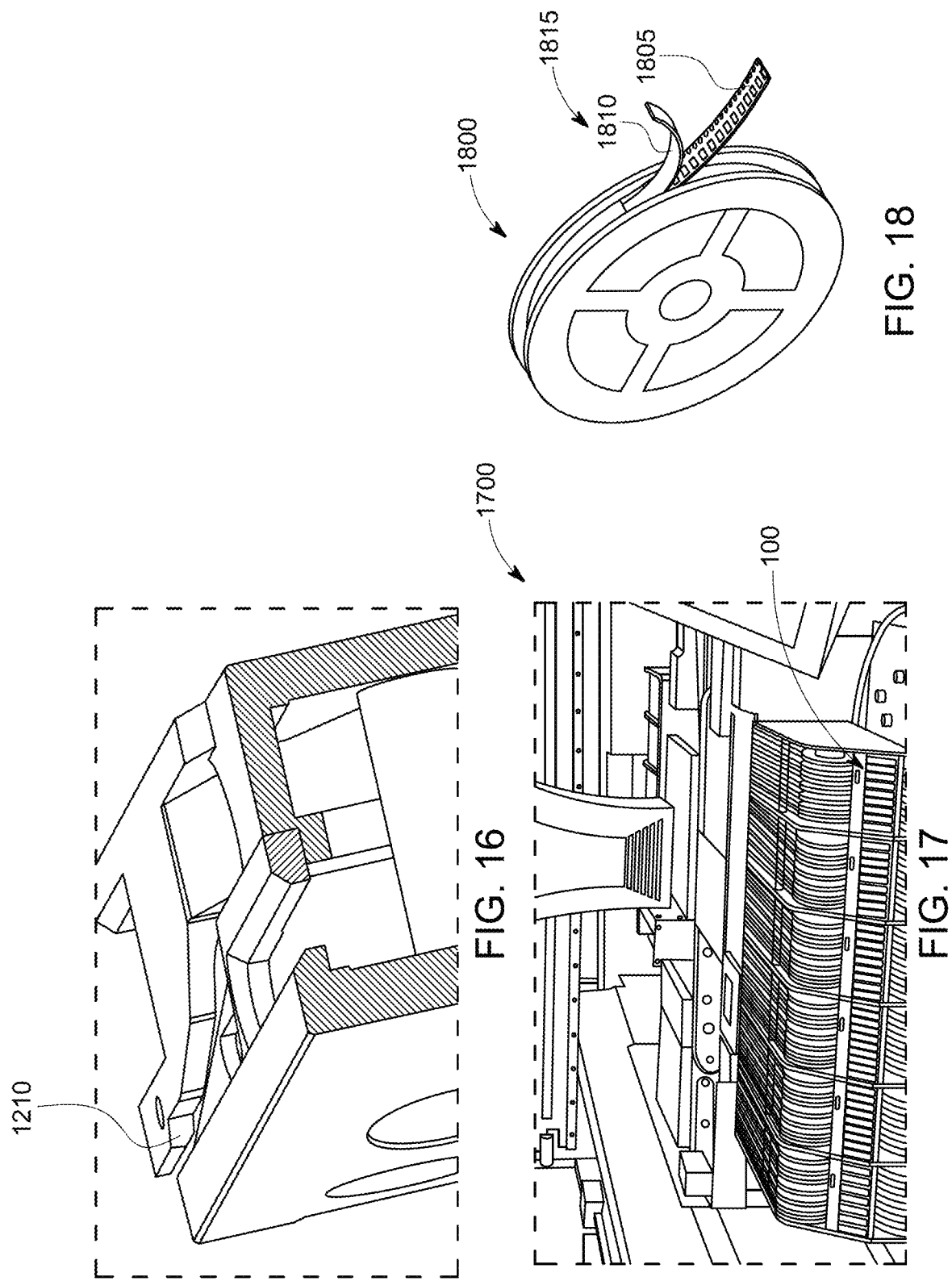

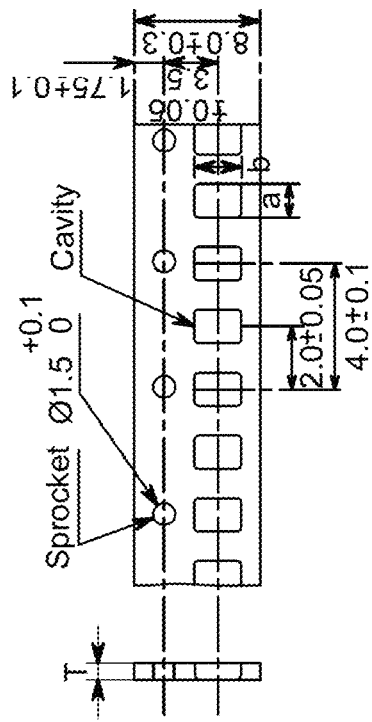
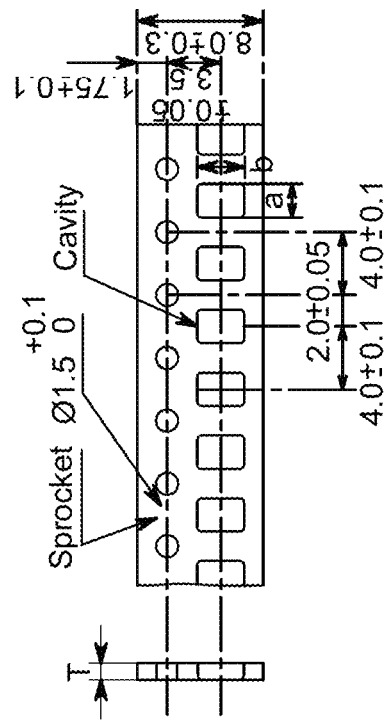
Tape dimensions (paper 2mm pitch)
| Types | a | b | T |
|---|---|---|---|
| RR0306/ RT0603 | 0.38±0.03 | 0.68±0.03 | 0.31±0.02 |
| RR/RT0510 | 0.63±0.06 | 1.13±0.06 | 0.43±0.06 |
| RG/RGT/NRG/ RS/RGA1005 | 0.63±0.05 | 1.13±0.06 | 0.43±0.06 |
| RL0510 | 0.63±0.06 | 1.13±0.06 | 0.43±0.06 |
Tape dimensions (paper 4mm pitch)
| Types | a | b | T |
|---|---|---|---|
| RR/RT0816 | 1.1±0.1 | 1.9±0.1 | 0.6±0.06 |
| URG/RG/RGT NRG/RGA1608 | 1.1±0.1 | 1.9±0.1 | 0.6±0.06 |
| RL0816 | 1.1±0.1 | 1.9±0.1 | 0.6±0.06 |
| RR/RT1220 | 165±0.2 | 2.4±0.2 | 0.75±0.06 |
| URG/RG/RGT MRG/NRG/ RGA2012 | 165±0.2 | 2.4±0.2 | 0.75±0.06 |
| RL1220 | 165±0.2 | 2.4±0.2 | 0.75±0.06 |
Tape dimensions (embossed tape 4mm pitch)
FIG. 29

COMPONENT FEEDER MECHANISM WITH FLOATING FRAME

CROSS-REFERENCES TO OTHER APPLICATIONS

This application claims priority to U.S. provisional patent application Ser. No. 62/968,137 for "COMPONENT TAPE HANDLING DEVICE", filed on Jan. 30, 2020, which is hereby incorporated by reference in entirety for all purposes.

BACKGROUND

Currently there are a wide variety of component tape handling systems. New component tape handling systems are needed to accommodate variations in component tape size and mechanical properties.

SUMMARY

In some embodiments a mechanism comprises a base having a top surface and including a groove extending along the top surface. A frame is flexibly coupled to the base and includes a right side and a left side. The right side has a substantially "L-shaped" cross-section and includes a knife portion and a creasing portion. The side has a substantially "L-shaped" cross-section and is rigidly coupled to the right side such that the frame has a substantially "U-shaped" cross-section that is sized to receive at least a portion of the base. A first spring is positioned proximate the knife portion and is arranged to control a compressive force between the knife portion and the base. A second spring is positioned proximate the creasing portion and is arranged to control a compressive force between the creasing portion and the base. A first fastener is flexibly couples the frame to the base allowing the frame to translate linearly relative to the base and to rotate relative to the base. A second fastener flexibly couples the frame to the base allowing the frame to translate linearly relative to the base and to rotate relative to the base.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIGS. 1-16 are views of an electronic component feeding system having a floating frame, according to embodiments of the disclosure;

FIG. 17 is an image of an example pick and place machine, according to embodiments of the disclosure;

FIG. 18 is an isometric view of a reel of electronic component tape, according to embodiments of the disclosure;

FIG. 29 is an chart of example component tape dimensions, according to embodiments of the disclosure.

DETAILED DESCRIPTION

Techniques disclosed herein relate generally to pick and place systems for manufacturing electronic assemblies. More specifically, techniques disclosed herein relate to component tape handling devices that use an adaptive floating frame that applies a controlled pressure to both a knife region and a creasing region to adapt to variations in component tape geometry and mechanical properties, as described in more detail herein. Various inventive embodiments are described herein, including methods, processes, systems, devices, and the like.

Type-F Detachment Mechanism

Figure 1:
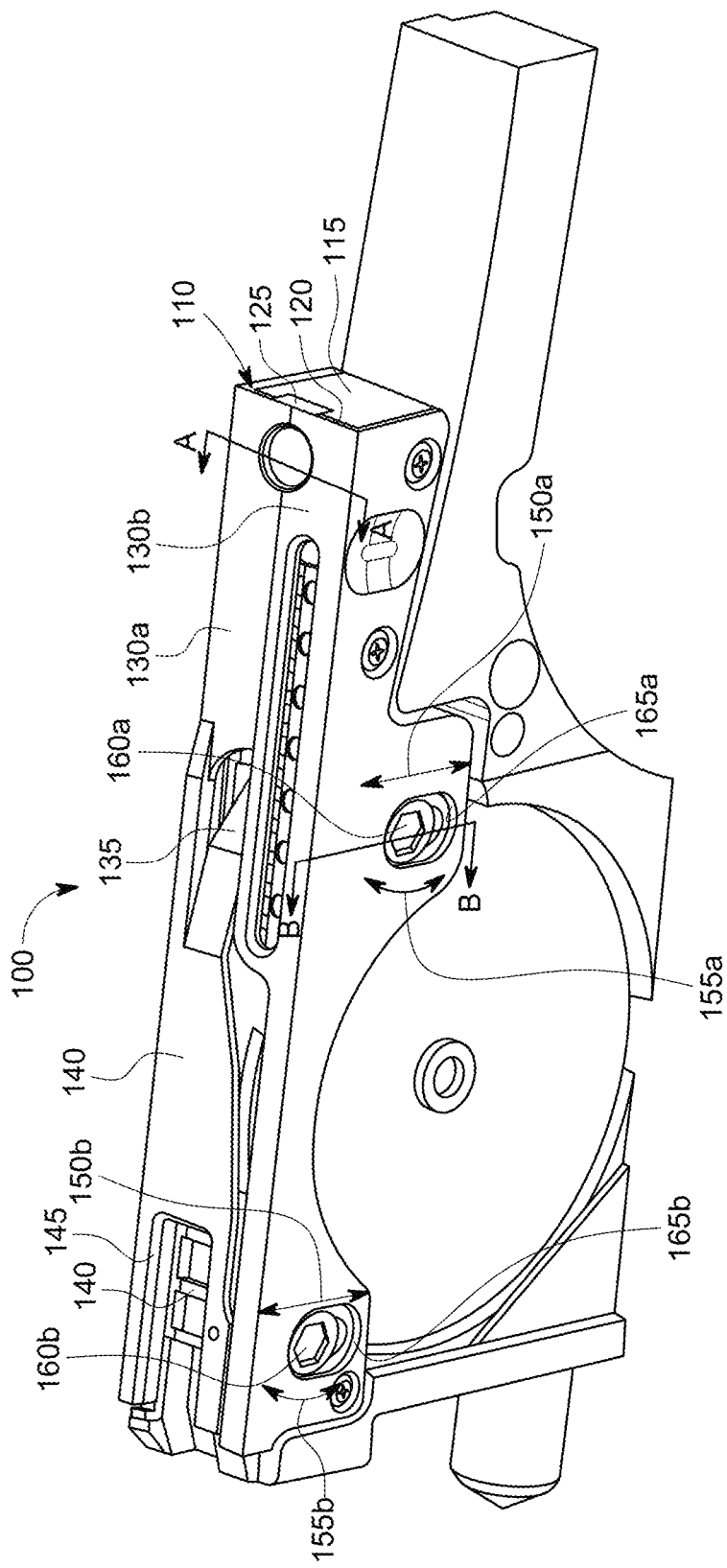

FIG. 1 depicts an illustrative rendering of a component tape feeder cassette 100 with a floating frame covertape displacement mechanism 110, according to embodiments of the disclosure. As shown in FIG. 1, tape feeder cassette 100 includes a base 115 having a top surface 120 including a groove 125 formed therein and extending along the top surface. Floating frame 110 is flexibly coupled to base 115 and includes a right side 130*a* attached to a left side 130*b*. Right side 130*a* has a substantially "L-shaped" cross-section and includes a knife portion 135 followed by a creasing portion 140. Left side 130*b* also has a substantially "L-shaped" cross-section and is rigidly coupled to right side 130*a* such that floating frame 110 has a substantially "U-shaped" cross-section that is sized to receive at least a portion of base 115. Component tape 140 is fed along top surface 120 of base 115 and moves from right to left with respect to the image shown in FIG. 1. A portion of the component tape called covertape (not shown in FIG. 1, but described in more detail below) is decoupled from the component tape via knife portion 135 and is folded back on itself and creased by creasing portion 140 so the components are exposed in pickup portion 145 of floating frame, as described in greater detail below.

Floating frame 110 is held in contact with component tape 140 via a first and a second spring (not shown in FIG. 1, but described in more detail below) that apply a controlled compressive force between the floating frame and the component tape, as described in more detail below. Frame 110 is allowed to float relative to base 115 in a substantially rectilinear path via first and second fasteners 160*a*, 160*b*, as shown by arrows 150*a*, 150*b* and to rotate relative to base as shown by arrows 155*a*, 155*b*. The combination of the first and second springs and first and second fasteners 160*a*, 160*b* allows frame 110 to apply a controlled and consistent pressure to knife region 135 to allow knife region to float up and down to accommodate variations in component tape 140 thickness. These features also enable creasing portion 140 to float, not only accommodate variations in tape geometry, but also to allow the pressure applied to crease the covertape to be consistent over variations in geometry and mechanical properties. Further, the floating feature enables frame 110 to hold the opposite side of the covertape (e.g., the side that is not being detached by knife portion 135, to be held in place with adequate pressure so the entire covertape is not removed from the component tape. These features will be described in greater detail below.

For example, without the floating capability of frame 110, if the component tape came in and was thinner than normal with a covertape that had a higher modulus of elasticity than normal, the creasing operation may not work and the covertape may fold back over the components in pickup region 145. As another example, if the component tape came in thicker than normal and the covertape came in thicker than normal, without the ability to float the covertape may become jammed between the frame and the base (e.g., if the frame was rigidly coupled to the base). Further, frame 110 has the ability to substantially independently vary the pressure on the knife region (e.g., via first spring) and on the creasing region (e.g., via second spring) in the case that a particular spring rate for one region may not work for the other region. As another example, applying the appropriate amount of force to creasing portion 140 enables the creasing portion to crease and fold, but not to catch and stop the cover tape from passing by. Too little force applied and the crease would not be formed and the entire cover tape may come off from inadequate force holding the glue line that is not severed (e.g., the glue line proximate the perforations, see below) in place. Without the ability to float, the position of frame 110 relative to base would have to be mechanically adjusted each time variations in component tape were not compatible with the current adjustment.

As further shown in FIG. 1, first and second fasteners 160a, 160b flexibly couple frame 110 to the base 115 allowing the frame to translate rectilinearly relative to the base and to rotate relative to the base. In this particular embodiment first and second fasteners 160a, 160b include bolts secured to the base and include heads arranged to slide in corresponding slots 165a, 165b formed in frame 110, however other embodiments may employ a different suitable mechanism.

Figure 2:
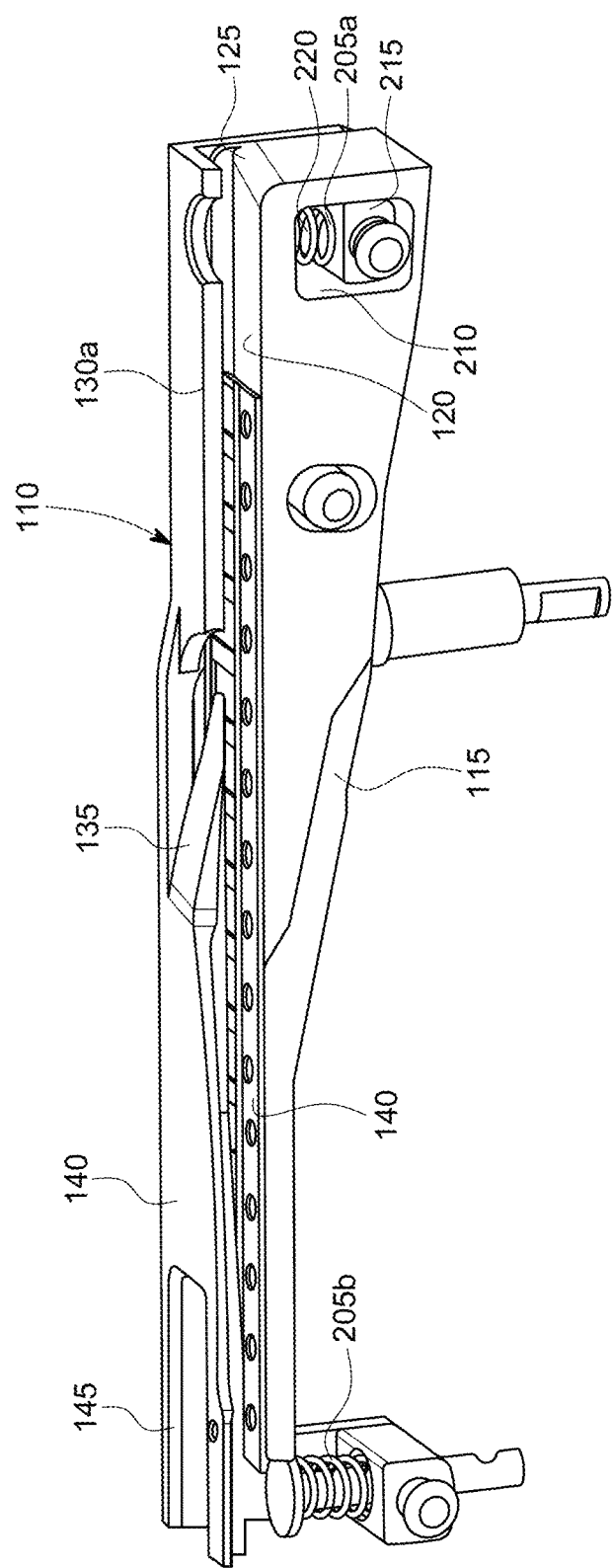

FIG. 2 illustrates a partial side view of right side 130a of frame 110 positioned on base 115 and component tape 140 positioned in-between the frame and the base. As shown in FIG. 2, first compression spring 205a is positioned proximate knife portion 135 and substantially controls a compressive force between the knife portion and base 115. Similarly, second compression spring 205b is positioned proximate creasing portion 140 and substantially controls a compressive force between the creasing portion and base 115. In some embodiments each of first and second springs 205a, 205b may have different spring characteristics such as, but not limited to, spring rate or free length. In other embodiments each of first and second springs 205a, 205b may have the same spring characteristics.

Base 115 includes a pocket 210 that is sized to receive a boss portion 215 of frame 110 that is positioned at least partially within the pocket. First spring 205a is positioned between boss portion 215 and base 115 such that knife portion 135 of frame 110 is forced towards top surface 120 of base 115 such that component tape 140 is compressed between frame 110 and base 115. In some embodiments boss portion 215 can include a receiving cavity 220 configured to receive at least a portion of first spring 205a. In some embodiments, second spring 205b can have a similar boss and pocket arrangement, as described in more detail below.

Figure 3:
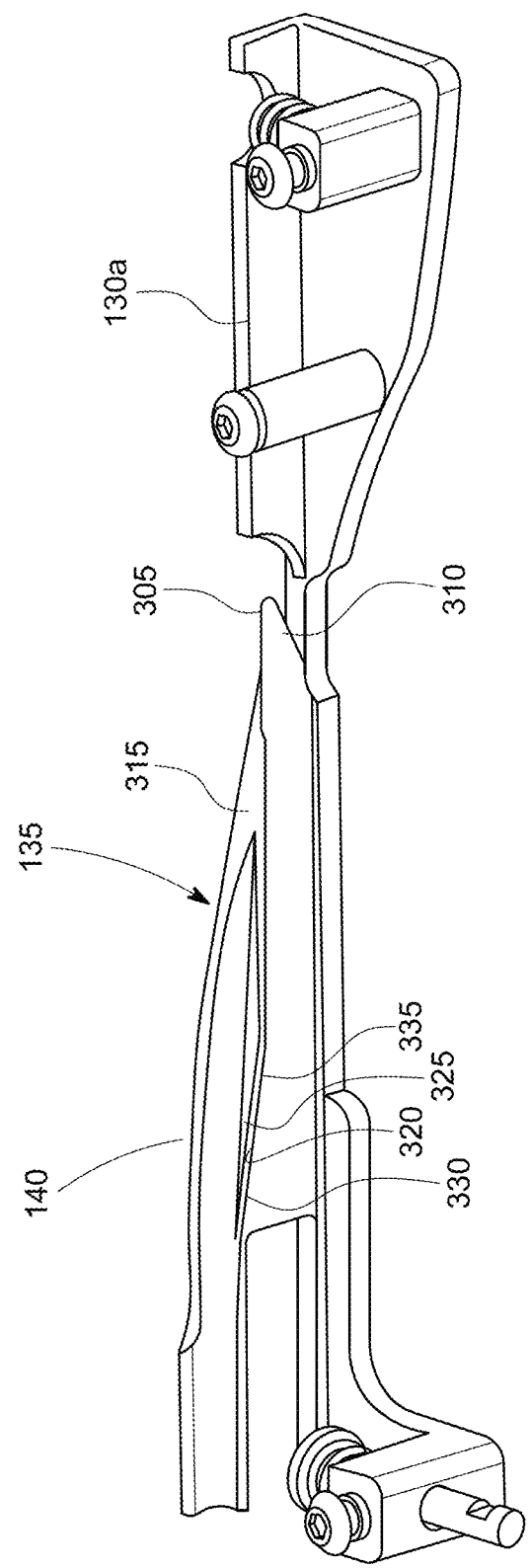

FIG. 3 illustrates a bottom view of the right side 130a of frame 110 showing both knife portion 135 and creasing portion 140 in greater detail. As shown in FIG. 3, a knife tip 305 is arranged to be positioned between the covertape and the carrier tape of the component tape. Leading edge 310 then separates the cover tape from the carrier tape along a first glue line opposite the drive perforations, as explained in more detail below in FIG. 8. Once one side of the cover tape is free and the component tape advances the cover tape is pushed up and away from the component tape via deflecting surface 315. Further advances of the component tape cause the deflecting surface 315 to further deflect the cover tape back over itself. Once the deflected cover tape reaches creasing portion 140 of right side 130a of frame 110, a creasing edge 320 forms a crease in the cover tape, so the covertape is folded back on itself.

Creasing portion 140 enables carrier tapes of multiple sizes to be used. More specifically, creasing edge 320 includes a wedge 325 that is oriented at an angle relative to slot 125 formed in base 115. Wedge 325 enables component tapes of various widths to be used. More specifically if first glue line (see FIG. 8) is close to the drive perforations in the component tape a last portion 330 of the wedge causes the crease. However if the glue line is further away from the drive perforations in the component tape a first portion 335 of the wedge causes the crease. The sloped shape of the wedge between first portion 335 and last portion 330 enables the floating frame 110 to handle various sizes of component tape enabling greater flexibility for operators and less machine down time for changeovers. For example, in one embodiment for an 8 mm tape feeder the wedge feature enables the removal and creasing of cover tape for electrical components all the way from 0201 sized components to 1206 sized components to be fed.

The force applied by the pressure plate (including the wedge and the creasing edges) is controlled predominantly by second spring 205b (see FIG. 2). Applying the appropriate amount of force to creasing portion 140 enables wedge 325 to crease and fold, but not to catch and stop the cover tape from passing by. Too little force applied to these features and the crease would not be formed and the entire cover tape may come off from inadequate force holding the second glue line that is not severed (e.g., see FIG. 8, the glue line proximate the perforations) in place.

Figure 4:
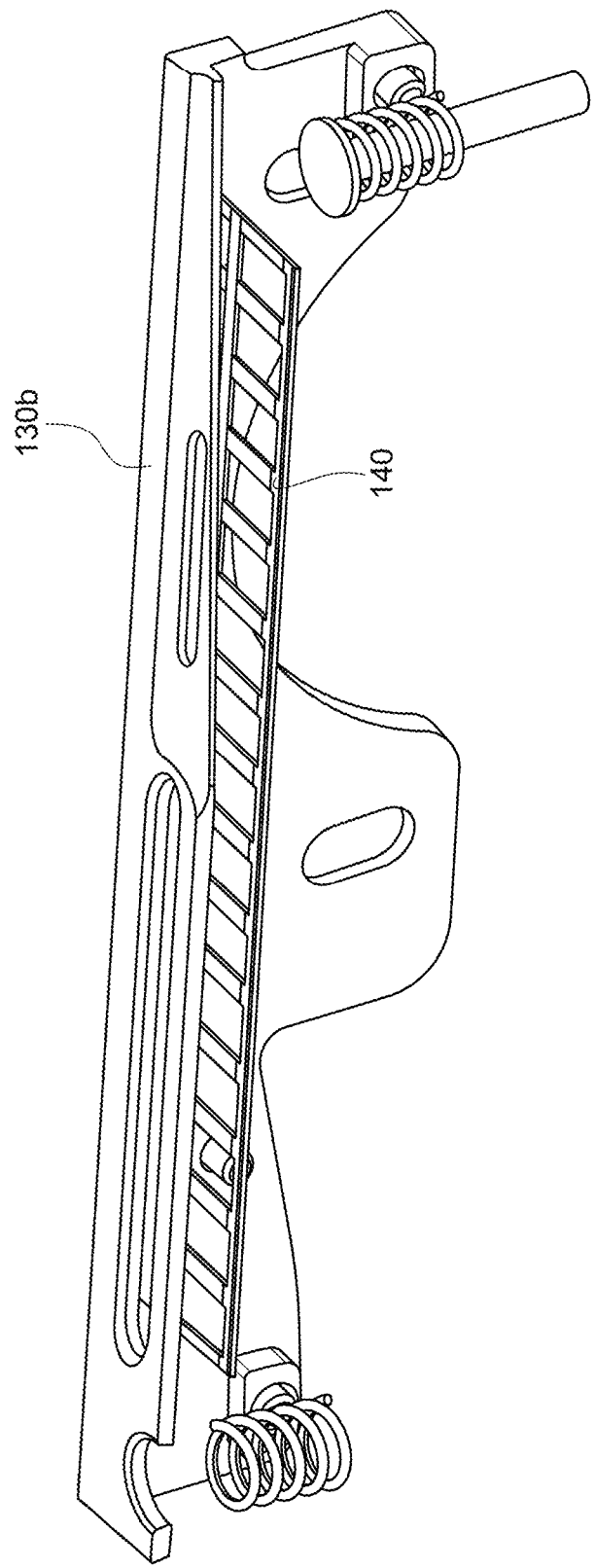

FIG. 4 illustrates an isometric view of left side 130b of frame 110 and a portion of component tape 140. Left side 130b of frame 110 holds component tape 140 in place during detachment of the covertape and enables the frame to have balanced forces allowing it to float. In some embodiments, having left side 130b of frame 110 as a separate component from right side 130a of the frame enables improved manufacturability so each component can be fabricated separately using, for example, machining, stamping, etching, casting, molding or other fabrication techniques. In further embodiments described in more detail below, having separate left and right portions of frame 110 enables an overlap region to be formed providing the ability to handle various sized component tapes and reliably fold the covertape back on itself. Further, a gap is formed between left and right side, 130b, 130a, respectively, of frame 110 to enable the covertape to stand up and be folded back on itself.

FIGS. 5A and 5B are cross-sections through location A-A of FIG. 1. As shown in 5A, left side 130b has a substantially "L-shaped" cross-section and is rigidly coupled to right side 130a such that frame 110 has a substantially "U-shaped" cross-section that is sized to receive at least a portion of base 110. Pocket 210 is formed in base and boss portion 215 of right side 130a extends into the pocket. First spring 205a is a compression spring and applies force between base 115 and frame 110, compressing component tape 140 therebetween. A fastener 505 rigidly attaches right side 130a to left side 130b. In this embodiment covertape 140 is relatively thin.

As shown in FIG. 5B, covertape 510 is thicker than covertape 140 and thus frame 110 has been moved up relative to base 115 causing first spring 205a to compress. As a thickness of covertape 140, 510 varies, frame 110 floats relative to base 115 to accommodate the thickness.

FIGS. 6A and 6B show a similar scenario as FIGS. 5A and 5B where in FIG. 6A a relative thin component tape 140 is used and in FIG. 6B a thicker component tape 510 is used. As shown in FIG. 6A first fastener 160a is a bolt having a head 605 that slides in slot 165a. As shown in FIG. 6B, when a thicker component tape 510 is used head 605 is positioned at a lower region of slot 165a. Thus, fastener 160a allows frame 110 to float in a rectilinear path and rotationally relative to base 115.

Figure 7:
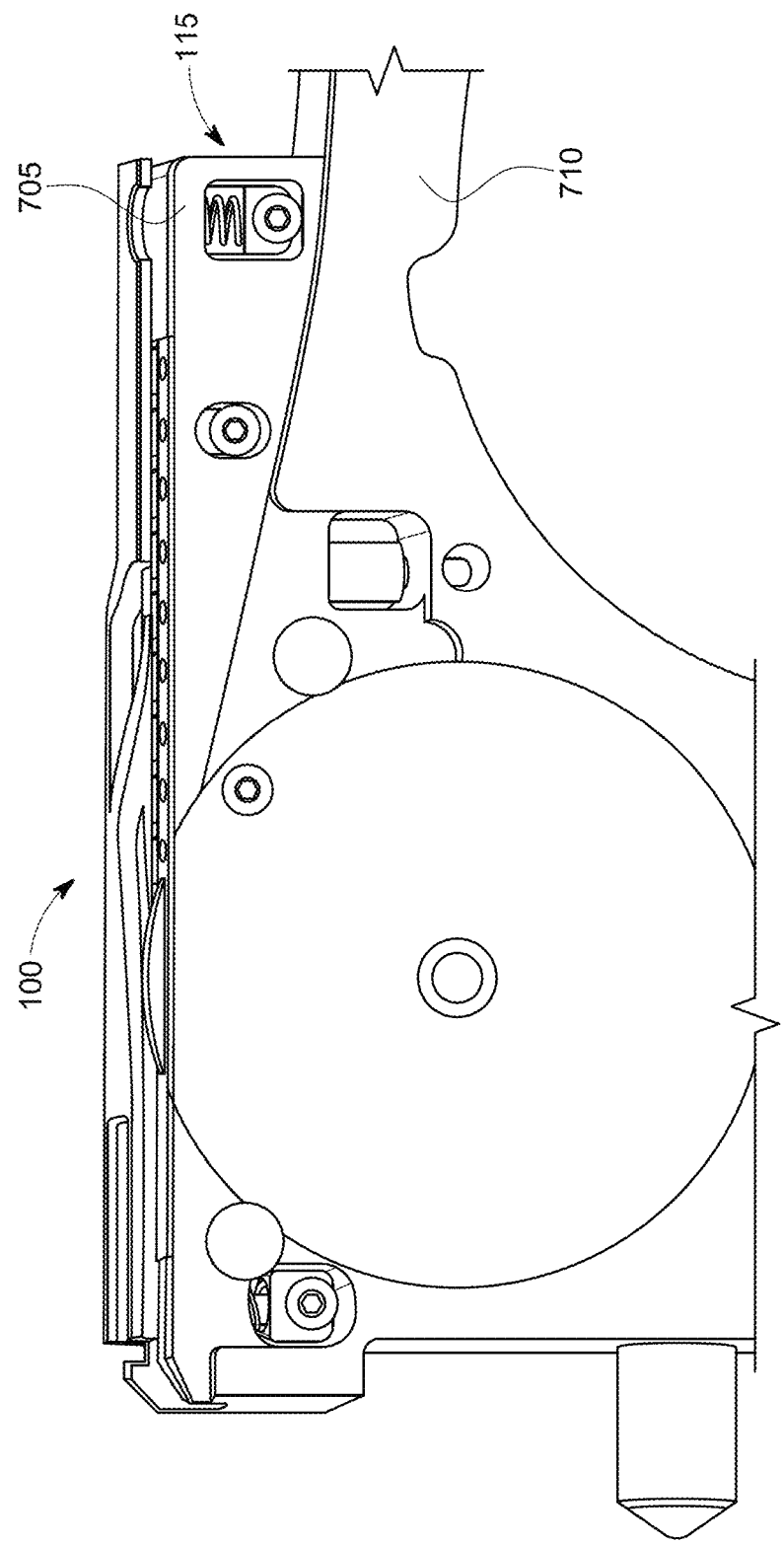

FIG. 7 illustrates a partial view of component tape feeder cassette 100. As shown in FIG. 7, base 115 can include an insert portion 705 and a feeder assembly portion 710 that are coupled together.

Figure 8:
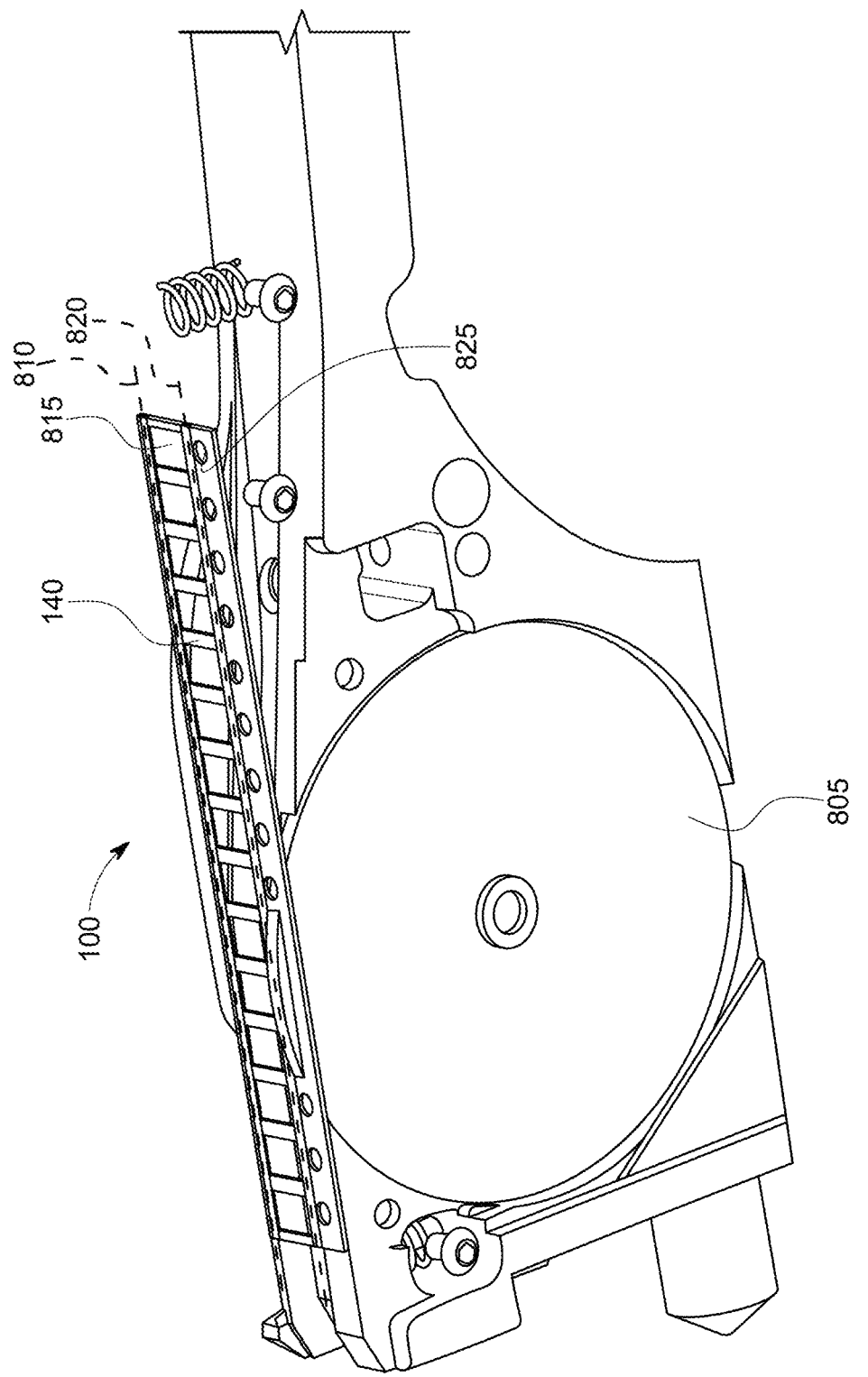

FIG. 8 illustrates a partial view of component tape feeder cassette 100 with component tape 140 engaged with a tape drive gear 805. As shown in FIG. 8, component tape 140 includes two glue lines, a first glue line 810 proximate component pockets 815 and a second glue line 820 proximate perforations 825 that engage with driver gear 805.

Figure 9:
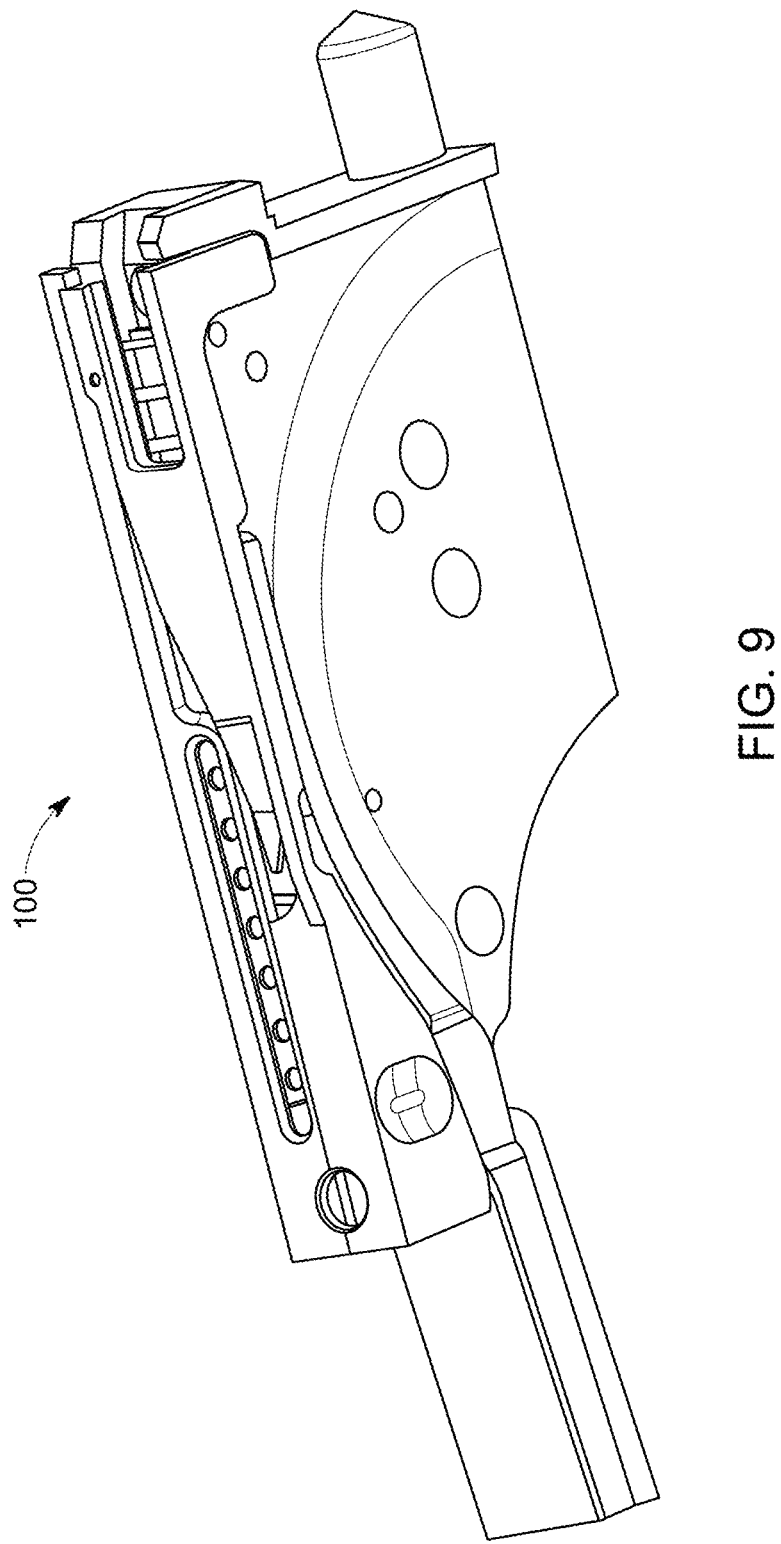

FIG. 9 illustrates a partial isometric view of the opposite side of component tape feeder cassette 100 shown in FIG. 1.

Figure 10:
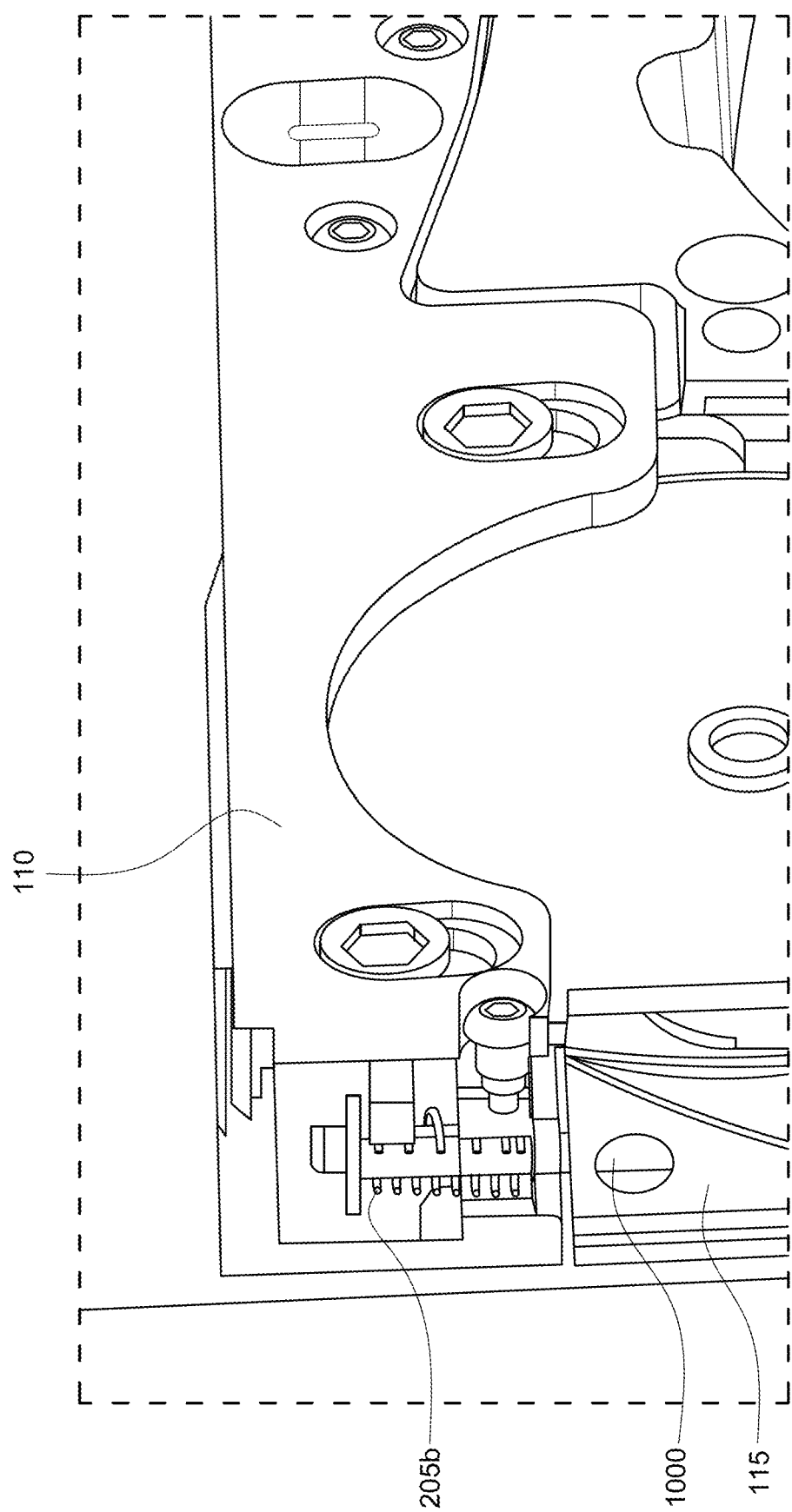

FIG. 10 illustrates a partial cross-sectional view of the second compression spring 205b. A guide pin 1000 is positioned within the rear compression spring 205b and is used to transfer force from the compression spring to the frame 110. As the compression spring applies force to the guide pin, the guide pin slides through an aperture formed in base 115.

Figure 11:
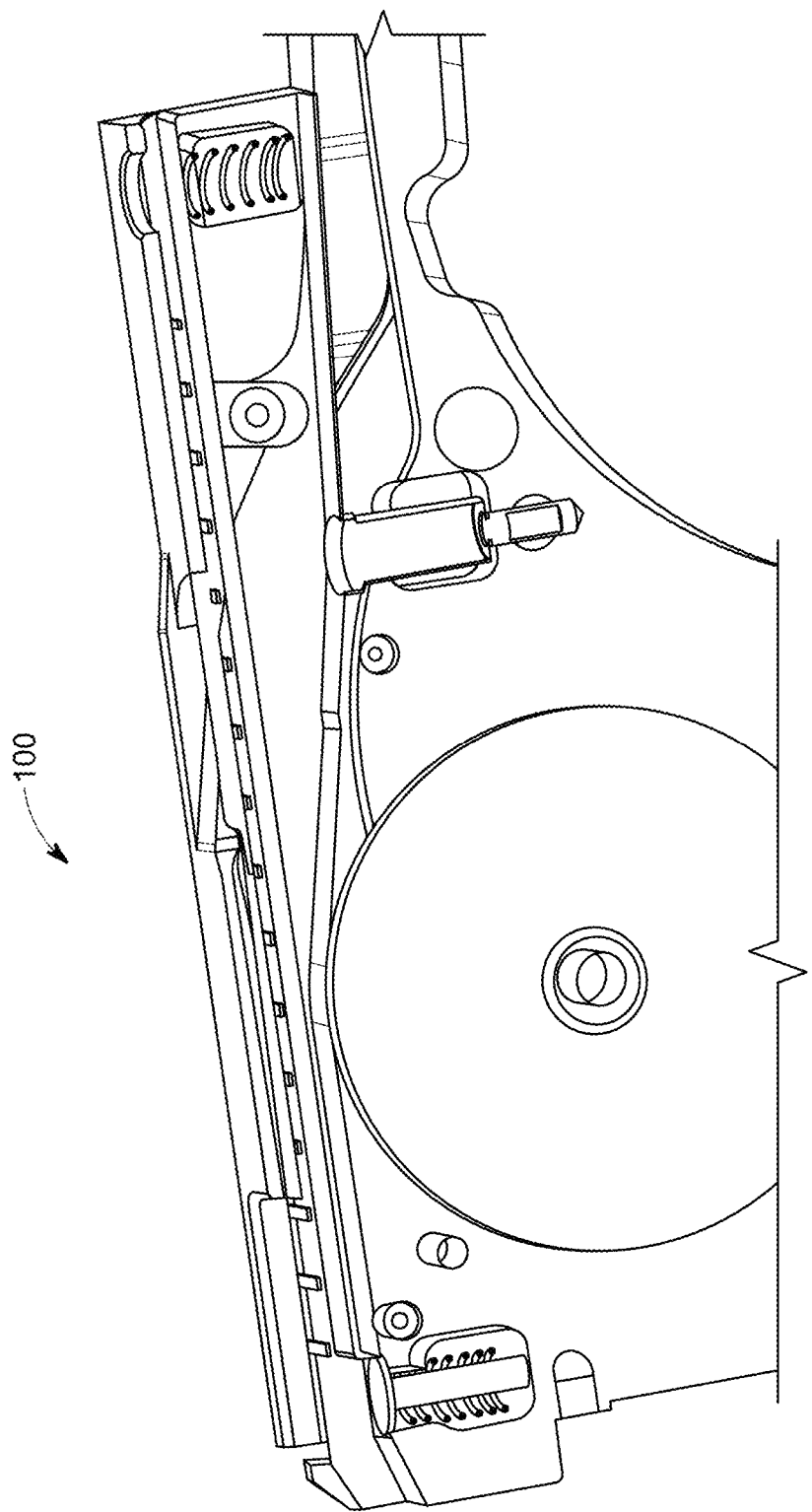

FIG. 11 illustrates a partial cross-sectional view of the front and the rear compression spring assemblies of component tape feeder cassette 100.

Overlapping Knife Region

FIG. 12 illustrates a top view of the knife region 135 and the overlap region 1205 of one embodiment of frame 110. As the component tape traverses through the frame, the knife region 135 detaches one edge of the cover tape, then the detached portion travels through the overlapping region 1205. The angled overlapping region and wedge 325 of the creasing region accommodate different widths in the cover tape. More specifically, in the overlap region 1205 a portion of right side 130a overlaps a portion of left side 130b where the portion of the right side is above the portion of the left side.

The overlapping region 1205 causes the cover tape to be folded back on itself, but the left side 130b remains positioned between the detached edge of the cover tape and the component tape. The overlap region incrementally folds the cover tape back on itself until the detached cover tape reaches the deflector 1210 which causes the cover tape to be deflected out and away from the component pick up region.

FIG. 13 illustrates a bottom view of the overlap region 1205 and the wedge 325.

FIG. 14 illustrates a cross-section of the overlap region 1205 and shows the deflector 1210.

FIG. 15 illustrates another cross-section of the overlap region 1205 showing the gap between the knife frame and the guide frame.

FIG. 16 illustrates a top isometric view showing the deflector 1210.

In some embodiments, to manufacture the overlapping region, the knife frame may be separate from the guide frame. Fasteners or other devices can be used to fasten the knife frame to the guide frame after manufacturing.

Machines and Component Tape Examples

FIG. 17 illustrates an example pick and place system 1700 with a plurality of component tape feeder cassettes 100.

FIG. 18 illustrates an example component tape reel 1800. As shown in FIG. 18, component tape 1815 is wound on reel and includes a carrier tape portion 1805 secured to a covertape portion 1810 with a pair of glue lines.

Type-E Detachment Mechanism

Figure 19:
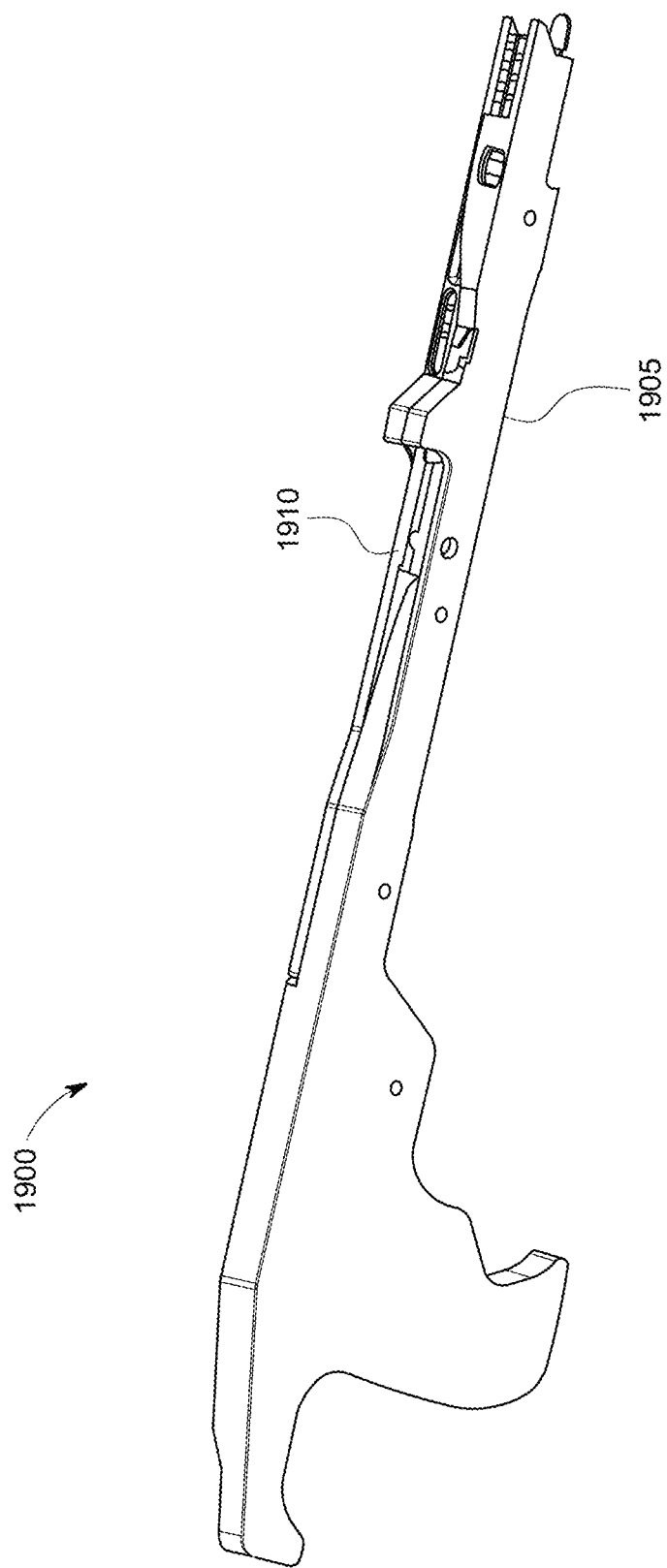
FIGS. 19-28 are views of an electronic component feeding system having a floating rail, according to embodiments of the disclosure.

FIG. 19 illustrates a partial isometric view of another floating frame 1900, in accordance with embodiments of the invention. This embodiment is constructed differently, having a floating internal insert as opposed to the floating external frame described above with regard to FIGS. 1-16, however the features and benefits of the floating internal insert are the same as described above with regard to being able to accommodate a wide variation in component tape dimensions.

In this embodiment the detachment mechanism includes a knife frame 1905 attached to a guide frame 1910 and a component tape 1915 is fed though the detachment mechanism. A knife portion 1920 of the knife frame detaches a portion of the cover tape from the component tape 1915 and features in the knife frame fold the cover tape back on itself and deflect it out of the way of the component pick up region.

In this embodiment an insert (not shown in FIG. 19) is configured to "float" within the detachment mechanism, as explained in more detail below. More specifically, as component tape 1915 is fed though the detachment mechanism 1900, the floating insert floats up and down (within the detachment mechanism) so that a controlled and consistent amount of clamping force is applied to the component tape, regardless of the component tape thickness, as described above. The clamping force is applied by one or more springs (described below) that allow knife frame 1905 and guide frame 1910 to hold component tape in place so the knife portion 1920 can detach the cover tape and the detachment mechanism can apply an appropriate amount of clamping force to the cover tape to cause it to be deflected and to be creased back on itself so it remains out of the component pick up region. As the thickness and type of cover tape can widely vary, the floating insert enables consistent performance by not applying too much force to the cover tape causing it to jam and not applying too little force causing the cover tape to not be deflected and remain out of the way of the component pick-up region, as described in more detail above.

Figure 20:
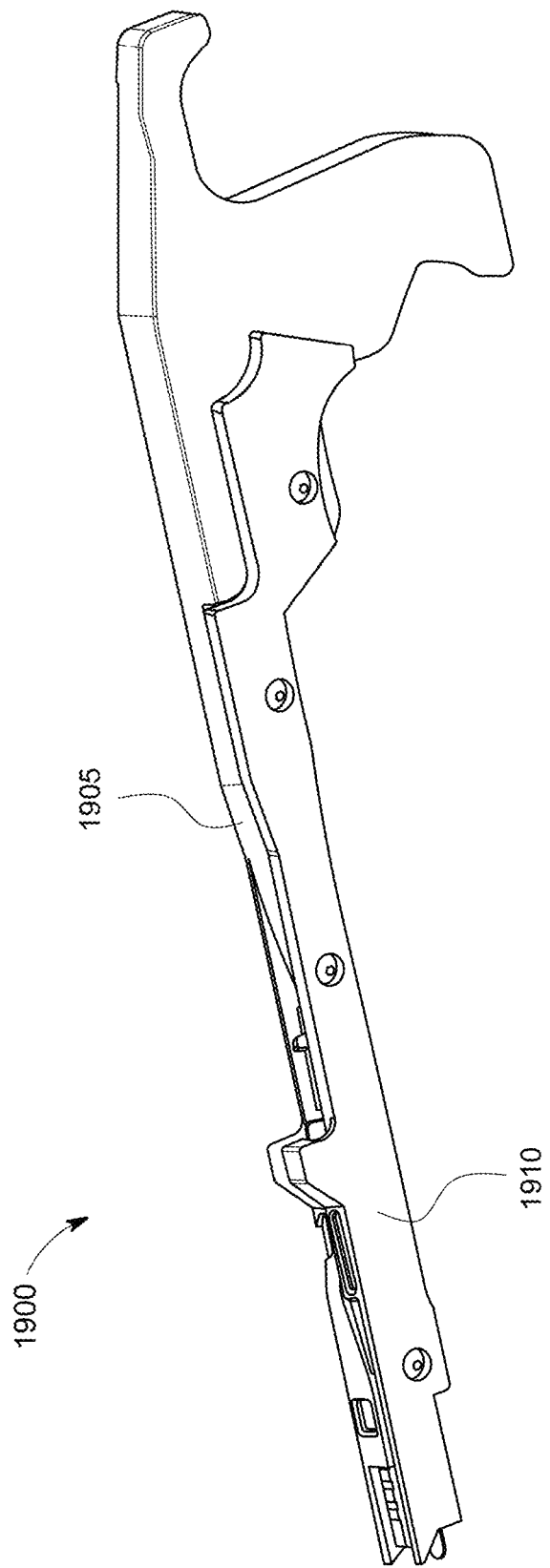

FIG. 20 illustrates an isometric view of the guide frame 1910 side of the detachment mechanism 1900.

Figure 21:
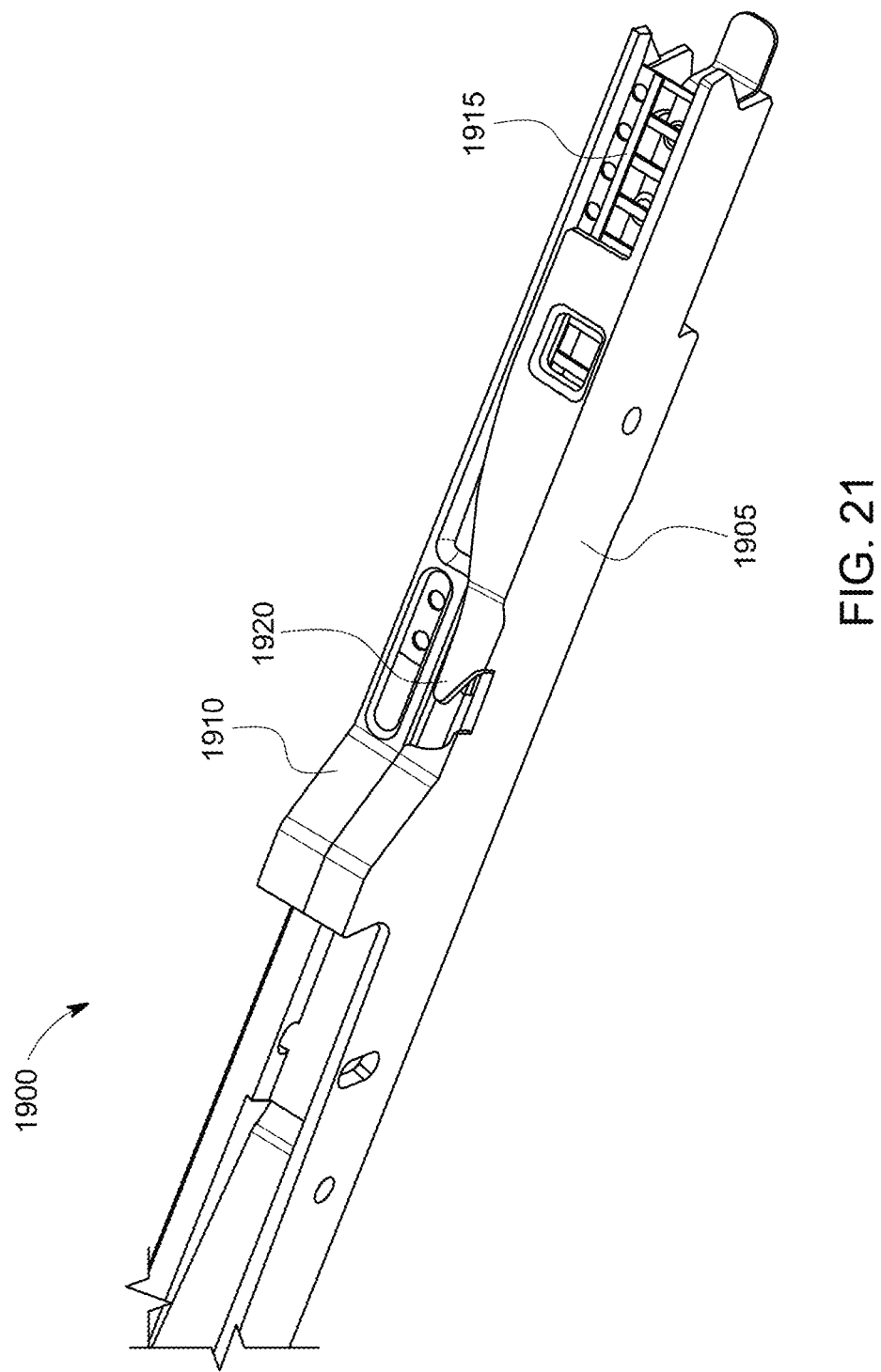

FIG. 21 illustrates a close-up isometric view of the knife portion 1920 of the detachment mechanism 1900.

Figure 22:
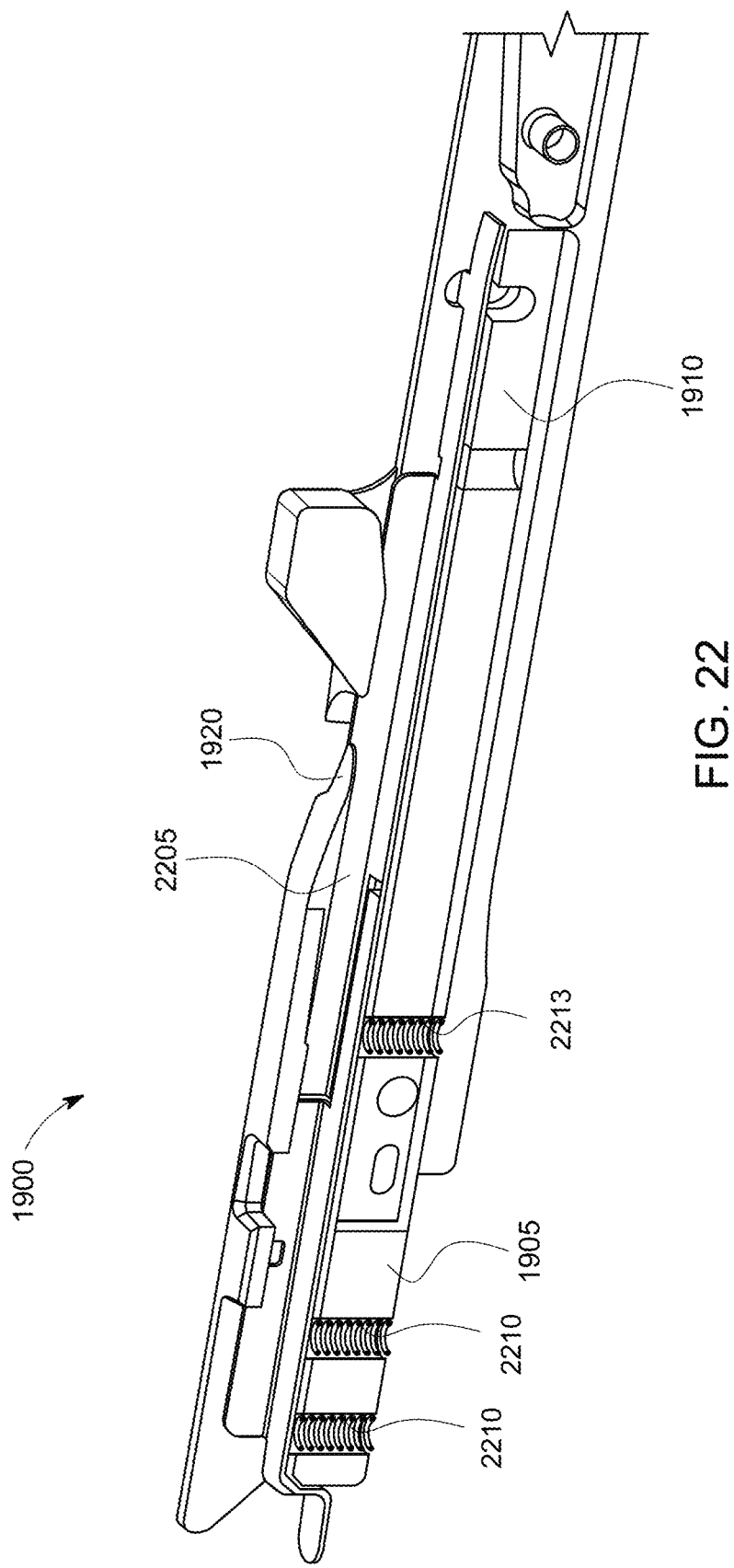

FIG. 22 illustrates a partial cross-sectional view of the detachment mechanism 1900 showing the floating insert 2205 supported by two front compression springs 2210 and one rear compression spring 2210. Different numbers of front and rear compression springs can be used in other embodiments. As shown the compression springs 2205,2210 apply an upward force against the floating insert 2205, forcing it towards the knife frame 1905 and clamping the component tape between the floating insert 1900 and the knife frame 1905 and guide frame 1910, similar as described in the above embodiment.

Figure 23:
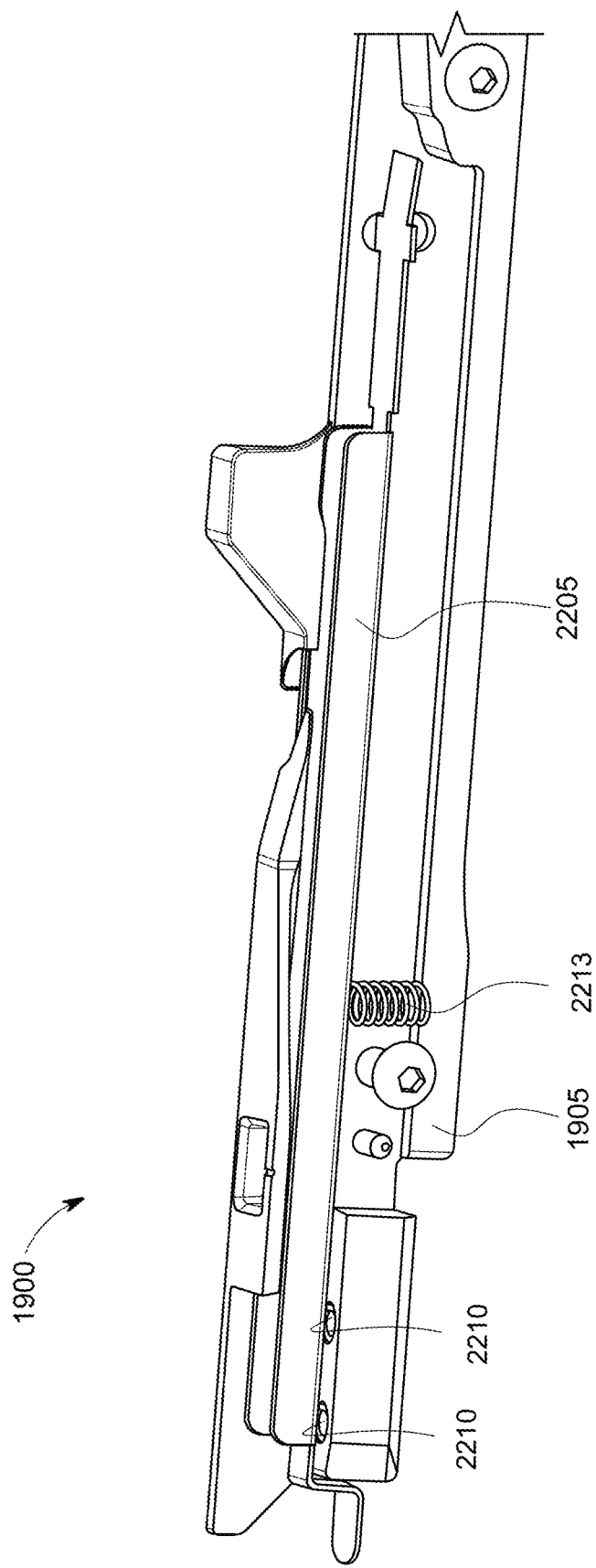

FIG. 23 illustrates the knife frame 1905 and the insert 2205. The front compression springs are positioned within cavities formed in the knife frame. As shown, the floating insert 2205 includes a pair of parallel rails that are used to clamp the component tape to the knife frame 1905.

Figure 24:
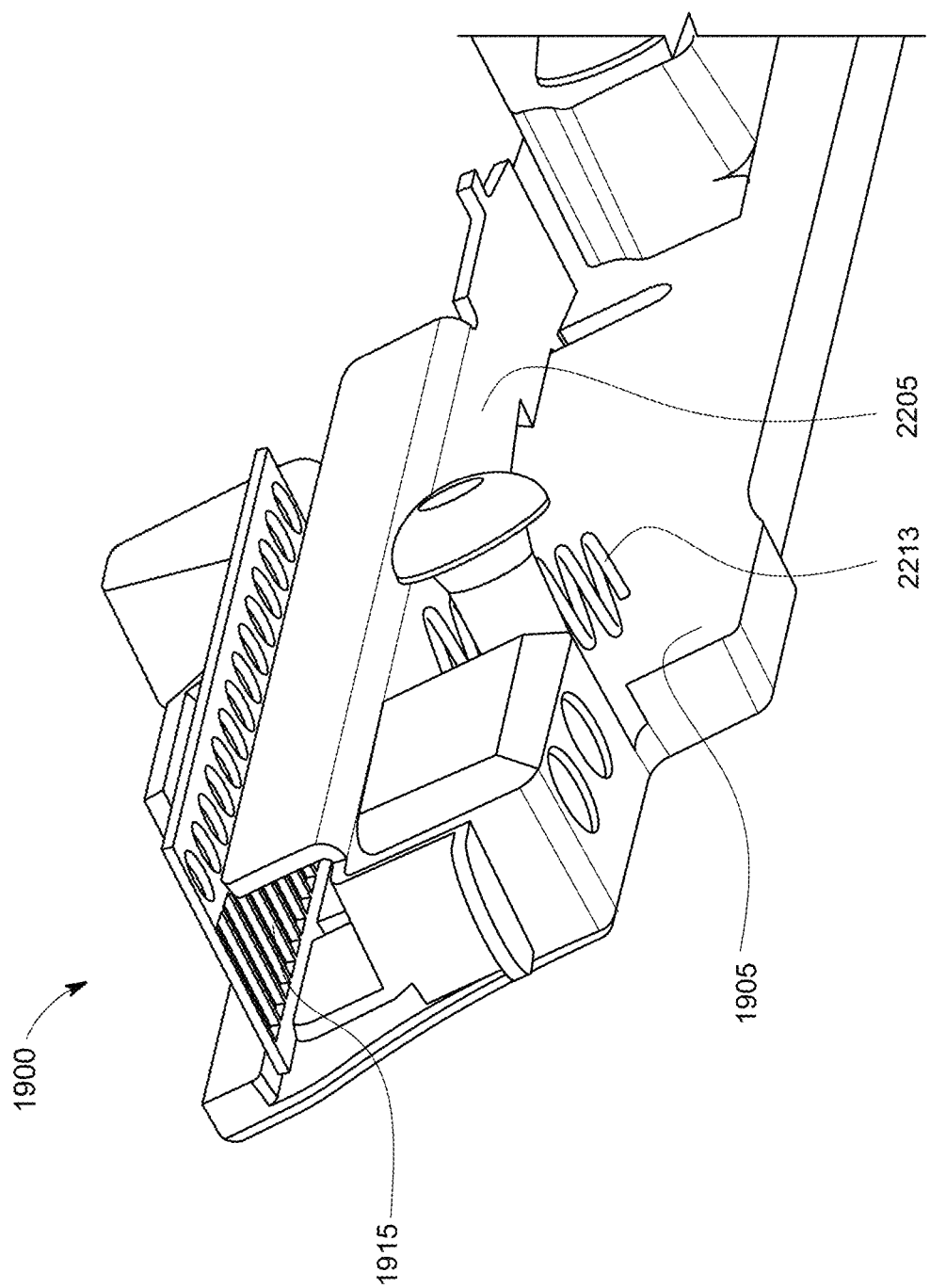

FIG. 24 shows a simplified view of the knife frame 1905, the floating insert 2205 and the component tape 1915. As shown the pair of parallel rails are clamping the component tape to the bottom surface of the knife frame 1905.

Figure 25:
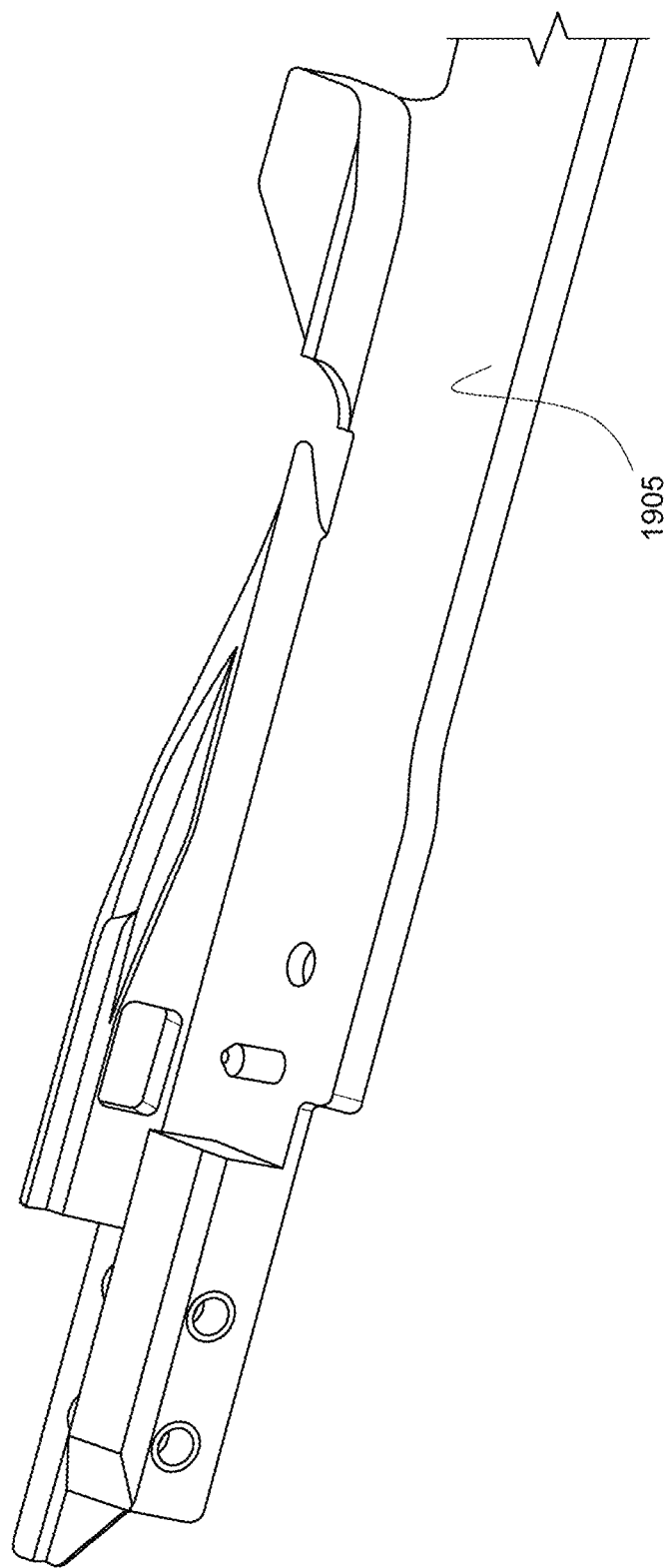

FIG. 25 shows a view of the inside of the knife frame 1905.

Figure 26:
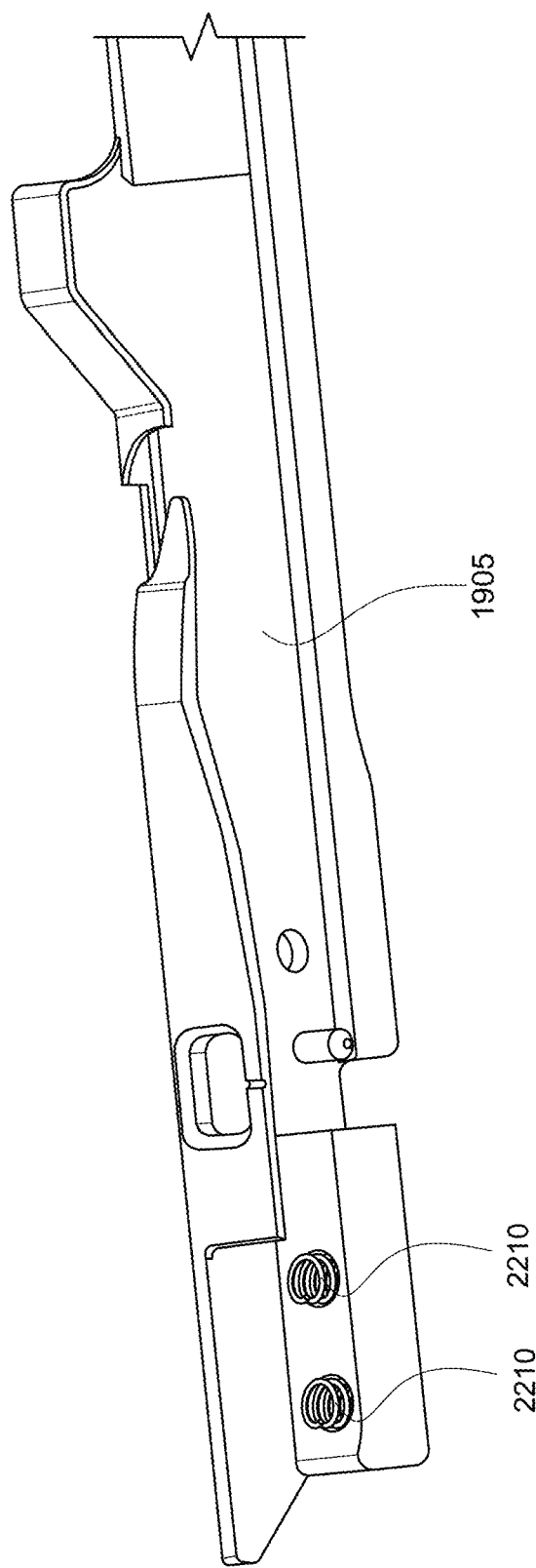

FIG. 26 shows a top isometric view of the knife frame 1905 and the front two compression springs 2205 in cavities formed in the knife frame.

Figure 27:
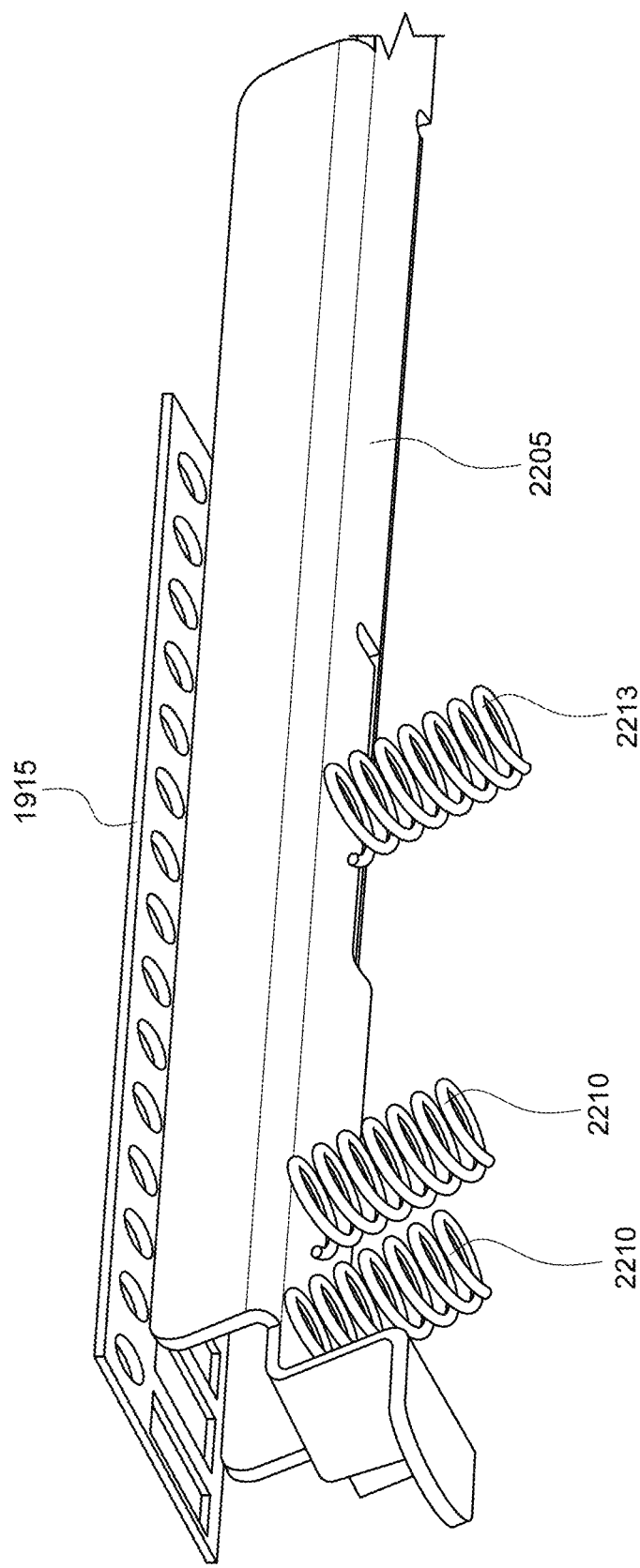

FIG. 27 shows an isometric view of the floating insert 2205 having two rails.

Figure 28:
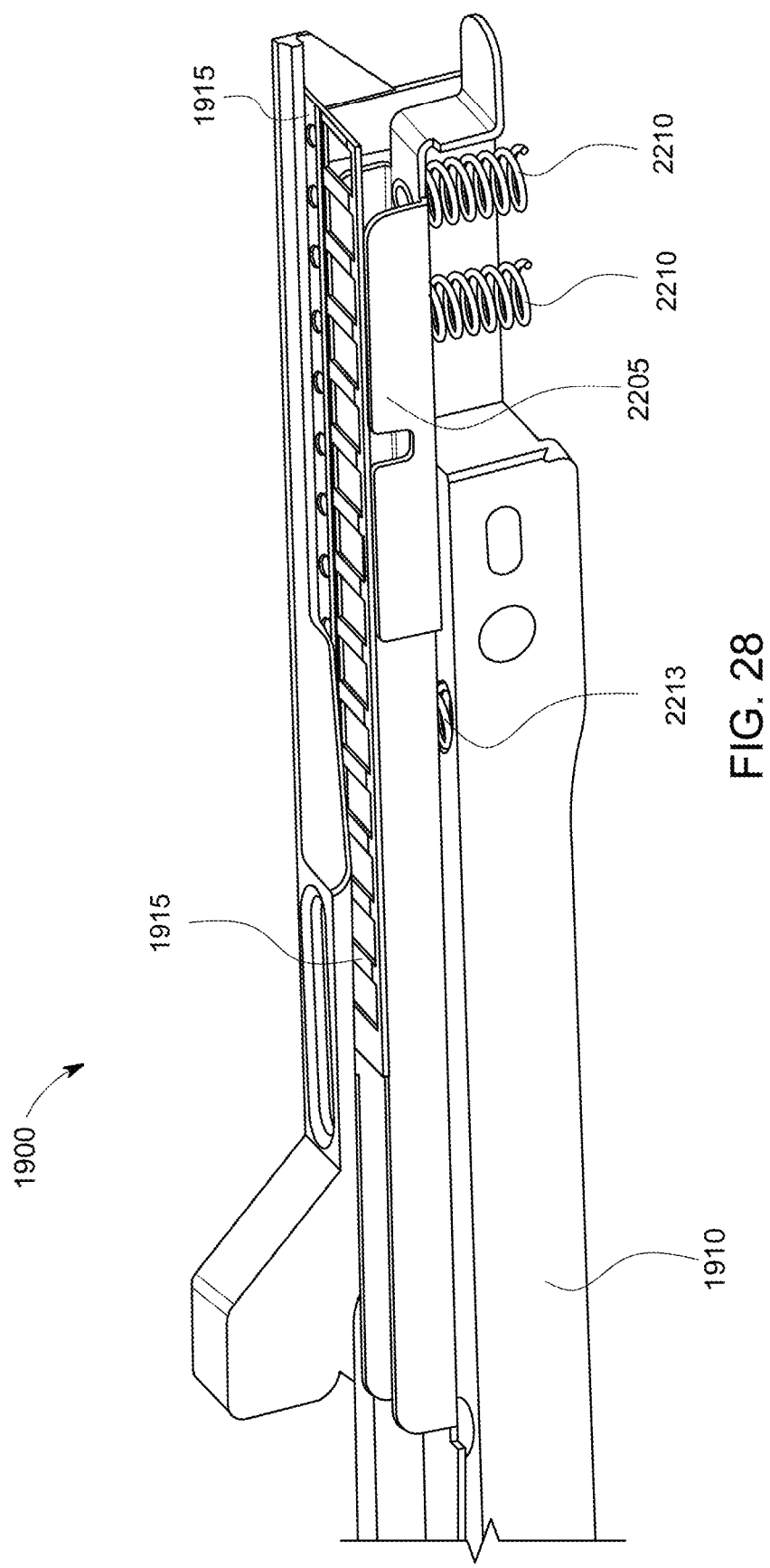

FIG. 28 shows a simplified view of the guide frame 1910 and the floating insert 2205. As shown the rear 2210 compression spring fits within a cavity formed in the guide frame 1910.

Types of Electrical Component Tape

FIG. 29 illustrates example electrical component tapes showing some of the variation in dimensions that are in common use. In some embodiments component tape can vary in width, cover tape location and width and tape thickness. Further, cover tape exits in multiple configurations including embossed plastic and paper-based tape. More specifically, FIG. 29 shows that for a fixed 4 mm pitch tape, the thickness can range from 0.31 mm to 0.75 mm, a variation of greater than two times. A floating frame system, as described herein, can maintain appropriate pressure on the wide variations in component tape to execute removal and folding/deflection of the cover tape. Variations in component tape width can be accommodated by an angled overlapping knife region and wedge, as described in more detail below.

Although the component feeders and detachment mechanisms are described and illustrated as two particular configurations, embodiments of the disclosure are suitable for use with a multiplicity of component feeders. For example, any component feeder can be used with embodiments of the disclosure. For simplicity, various internal components, such as motors, gears, various and other components of the feeder systems are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A mechanism for detaching a portion of a covertape from a tape, the mechanism comprising:
   a base having a top surface and including a groove extending along the top surface;
   a frame flexibly coupled to the base and including:
   a right side having a substantially "L-shaped" cross-section and including a knife portion and a creasing portion, wherein the knife portion is configured to detach one side of the covertape from the tape and wherein the creasing portion is configured to crease a portion of the covertape to fold back on itself; and
   a left side having a substantially "L-shaped" cross-section and rigidly coupled to the right side such that the frame has a substantially "U-shaped" cross-section that is sized to receive at least a portion of the base;
   a first spring positioned between the base and the frame proximate the knife portion and arranged to control a compressive force between the knife portion and the base;
   a second spring positioned between the base and the frame proximate the creasing portion and arranged to control a compressive force between the creasing portion and the base;
   a first fastener flexibly coupling the frame to the base allowing the frame to translate linearly relative to the base and to rotate relative to the base; and
   a second fastener flexibly coupling the frame to the base allowing the frame to translate linearly relative to the base and to rotate relative to the base, wherein the first spring, the second spring, the first fastener, and the second fastener allow the mechanism to accommodate a variation in a thickness of the tape.

2. The mechanism of claim 1 wherein the first spring has a different spring rate than the second spring.

3. The mechanism of claim 1 wherein the first spring has a same spring rate than the second spring.

4. The mechanism of claim 1 wherein the first and the second fasteners include bolts secured to the base and including heads arranged to slide in corresponding slots formed in the frame.

5. The mechanism of claim 1 wherein the base includes a pocket and the frame includes a boss that is positioned at least partially within the pocket.

6. The mechanism of claim 5 wherein the first spring is a compression spring positioned within the pocket and disposed between the frame and the boss.

7. The mechanism of claim 1 wherein the base includes an insert portion coupled to a feeder frame portion.

8. The mechanism of claim 1 wherein the knife portion includes a knife tip followed by a deflecting surface.

9. The mechanism of claim 1 wherein the creasing portion includes a creasing edge extending from a first portion to a second portion.

10. The mechanism of claim 9 wherein the creasing edge includes a wedge portion that is positioned at an angle relative to a direction of the groove.

11. The mechanism of claim 1 wherein the right side overlaps the left side in an overlap region.

12. The mechanism of claim 11 wherein a portion of the right side is positioned above a portion of the left side in the overlap region.

13. The mechanism of claim 11 wherein the right side includes a deflector at an end of the overlap region, the deflector configured to deflect the cover tape back on itself.

14. A method of exposing components, the method comprising:
   moving a tape that includes the components positioned under a covertape through a mechanism, the mechanism comprising:
   a base having a top surface and including a groove extending along the top surface, wherein the base is configured to allow the tape to slide along the top surface;
   a frame flexibly coupled to the base and including:
   a right side having a substantially "L-shaped" cross-section and including a knife portion and a creasing portion, wherein the knife portion is configured to remove a portion of the covertape from the tape and wherein the creasing portion is configured to crease a portion of the covertape to fold back on itself, and a left side having a substantially "L-shaped" cross-section and rigidly coupled to the right side such that the frame has a substantially "U-shaped" cross-section that is sized to receive at least a portion of the base;

a first spring positioned between the base and the frame proximate the knife portion and arranged to control a compressive force between the knife portion and the base;

a second spring positioned between the base and the frame proximate the creasing portion and arranged to control a compressive force between the creasing portion and the base;

a first fastener flexibly coupling the frame to the base allowing the frame to translate linearly relative to the base and to rotate relative to the base; and a second fastener flexibly coupling the frame to the base allowing the frame to translate linearly relative to the base and to rotate relative to the base, wherein the first spring, the second spring, the first fastener, and the second fastener allow the mechanism to accommodate a variation in a thickness of the tape.

15. The method of claim 14 wherein the first spring has a different spring rate than the second spring.

16. The method of claim 14 wherein the first spring has a same spring rate than the second spring.

17. The method of claim 14 wherein the right side overlaps the left side in an overlap region.

18. A frame assembly configured to be attached to a base for detaching a portion of a covertape from a tape, the frame assembly comprising:

a right side having a substantially "L-shaped" cross-section and including a knife portion and a creasing portion, wherein the knife portion is configured to detach a portion of the covertape from the tape and wherein the creasing portion is configured to crease a portion of the covertape to fold back on itself;

a left side having a substantially "L-shaped" cross-section and rigidly coupled to the right side such that the frame has a substantially "U-shaped" cross-section that is sized to receive at least a portion of the base;

a first spring positioned between the base and the frame proximate the knife portion and arranged to control a compressive force between the knife portion and the base;

a second spring positioned between the base and the frame proximate the creasing portion and arranged to control a compressive force between the creasing portion and the base;

a first fastener flexibly coupling the frame to the base allowing the frame to translate linearly relative to the base and to rotate relative to the base; and a second fastener flexibly coupling the frame to the base allowing the frame to translate linearly relative to the base and to rotate relative to the base, wherein the first spring, the second spring, the first fastener, and the second fastener allow the mechanism to accommodate a variation in a thickness of the tape.

19. The frame assembly of claim 18, wherein the first spring has a different spring rate than the second spring.

20. The frame assembly of claim 18, wherein the right side overlaps the left side in an overlap region.

\* \* \* \* \*